United States Patent
Lee et al.

(10) Patent No.: US 10,541,665 B2
(45) Date of Patent: Jan. 21, 2020

(54) BAW RESONATOR AND BAW FILTER FOR REDUCING HARMONIC DISTORTION

(71) Applicant: Samsung Electro-Mechanics Co., Ltd., Suwon-si (KR)

(72) Inventors: Moon Chul Lee, Suwon-si (KR); Tah Joon Park, Suwon-si (KR); Jae Chang Lee, Suwon-si (KR); Tae Yoon Kim, Suwon-si (KR); Chang Hyun Lim, Suwon-si (KR); Hwa Sun Lee, Suwon-si (KR); Tae Hun Lee, Suwon-si (KR); Hyun Min Hwang, Suwon-si (KR); Tae Kyung Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 193 days.

(21) Appl. No.: 15/876,791

(22) Filed: Jan. 22, 2018

(65) Prior Publication Data

US 2018/0294792 A1    Oct. 11, 2018

(30) Foreign Application Priority Data

Apr. 5, 2017 (KR) .................. 10-2017-0044156
Aug. 2, 2017 (KR) .................. 10-2017-0098232

(51) Int. Cl.
*H02H 9/02* (2006.01)
*H03H 9/60* (2006.01)
(Continued)

(52) U.S. Cl.
CPC .... *H03H 9/02086* (2013.01); *H03H 9/02133* (2013.01); *H03H 9/173* (2013.01);
(Continued)

(58) Field of Classification Search
CPC .......... H03H 9/02015; H03H 9/02086; H03H 9/02125; H03H 9/02133; H03H 9/171;
(Continued)

(56) References Cited

U.S. PATENT DOCUMENTS

| 7,548,140 B2 | 6/2009 | Jamneala et al. |
| 9,602,076 B1 * | 3/2017 | Kreuzer ............... H03H 9/205 |
| 2006/0290446 A1 | 12/2006 | Aigner et al. |
| 2008/0007369 A1 * | 1/2008 | Barber ............... H03H 9/02086 333/189 |

(Continued)

FOREIGN PATENT DOCUMENTS

| DE | 10 2006 032 950 A1 * | 1/2008 |
| JP | 2010-93398 A | 4/2010 |

(Continued)

OTHER PUBLICATIONS

Korean Office Action dated Jun. 21, 2018, in corresponding Korean Application No. 10-2017-0098232 (5 pages in English, 5 pages in Korean).

*Primary Examiner* — Barbara Summons
(74) *Attorney, Agent, or Firm* — NSIP Law

(57) ABSTRACT

A bulk acoustic wave (BAW) resonator includes: a substrate; a first BAW resonator including a first air cavity disposed in the substrate, and further including a first electrode, a first piezoelectric layer, and a second electrode stacked on the first air cavity; a second BAW resonator including a second air cavity disposed in the substrate, and further including a first electrode, a second piezoelectric layer, and a second electrode stacked on the second air cavity, wherein the second BAW resonator is connected in parallel to the first BAW resonator and has polarities that are opposite of polarities of the first BAW resonator; and a compensation capacitor circuit connected between the first BAW resonator and the second BAW resonator.

18 Claims, 13 Drawing Sheets

(51) Int. Cl.
*H03H 9/54* (2006.01)
*H03H 9/58* (2006.01)
*H03H 9/17* (2006.01)
*H03H 9/205* (2006.01)
*H03H 9/02* (2006.01)

(52) U.S. Cl.
CPC ............ *H03H 9/205* (2013.01); *H03H 9/542* (2013.01); *H03H 9/587* (2013.01); *H03H 9/605* (2013.01)

(58) Field of Classification Search
CPC .......... H03H 9/173; H03H 9/205; H03H 9/54; H03H 9/542; H03H 9/568; H03H 9/587; H03H 9/605; H03H 2009/02204
USPC .................................................. 333/187, 189
See application file for complete search history.

(56) References Cited

U.S. PATENT DOCUMENTS

| | | | | |
|---|---|---|---|---|
| 2008/0055020 | A1* | 3/2008 | Handtmann | H03H 9/0095 333/189 |
| 2008/0055021 | A1* | 3/2008 | Ueda | H03H 9/562 333/189 |
| 2011/0316649 | A1* | 12/2011 | Link | H03H 9/566 333/133 |
| 2017/0163242 | A1* | 6/2017 | Miyamoto | H03H 9/542 |

FOREIGN PATENT DOCUMENTS

| | | |
|---|---|---|
| KR | 10-2006-0134862 A | 12/2006 |
| KR | 10-0798168 B1 | 1/2008 |
| KR | 10-1270461 B1 | 5/2013 |
| WO | WO 2008/008151 A2 | 1/2008 |

* cited by examiner

BAW RESONATOR AND BAW FILTER FOR REDUCING HARMONIC DISTORTION

CROSS-REFERENCE TO RELATED APPLICATIONS

This application claims the benefit under 35 U.S.C. § 119(a) of Korean Patent Application Nos. 10-2017-0044156 and 10-2017-0098232 filed on Apr. 5, 2017 and Aug. 2, 2017, respectively, in the Korean Intellectual Property Office, the entire disclosures of which are incorporated herein by reference for all purposes.

BACKGROUND

1. Field

The following description relates to a harmonic distortion-attenuated bulk acoustic wave (BAW) resonator and BAW filter configured to reduce harmonic distortion using a compensation capacitor for trimming.

2. Description of Related Art

In recent years, with the trend for miniaturization of wireless communications devices, compactness of high frequency components including filters has been required. Particularly, for filters, downsizing has been required, even for bulk acoustic wave (BAW) resonator type filters using a semiconductor thin-film wafer manufacturing technique.

In general, BAW resonators are thin film type resonators that generate resonance through a piezoelectric dielectric material deposited on a silicon wafer, a semiconductor substrate, and using piezoelectric characteristics of the piezoelectric dielectric material. Such BAW resonator may be used in various applications, such as for a small, lightweight filter of a mobile communications device, a chemical and biological testing device, an oscillator, a resonant element, and an acoustic resonant mass sensor, and recently, a component associated with various frequency bands.

Further, as a single communications system requires various frequency bands, the requirements of out-band characteristics, as well as in-band characteristics, for BAW resonators and micro-electro-mechanical systems (MEMS) elements have gradually increased.

Meanwhile, in the application of wideband code division multiple access (WCDMA) or third-generation communications, a reduction in harmonic distortion, such as, for example, 2nd harmonic distortion (2HD), is emerging as an issue, in relation to intermodulation distortion (IMD) that may occur in BAW resonators and filters.

In addition, with the multifunctionalization and improved specifications in communications systems, improvements in interference characteristics with respect to filters and other peripheral elements have become important. Furthermore, to secure greater competitiveness, compact designs in the fabrication stage may be important in relation to the compact size of filters. However, precise characteristics adjustments after the fabrication of filters may be required.

In particular, the magnitude of harmonic distortion, such as 2HD, in common portable communications markets may be required to be equal to a predetermined level or lower (for example, about −40 dBm). Thus, there may be a need for development of BAW elements for satisfying such characteristics.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave (BAW) resonator includes: a substrate; a first BAW resonator including a first air cavity disposed in the substrate, and further including a first electrode, a first piezoelectric layer, and a second electrode stacked on the first air cavity; a second BAW resonator including a second air cavity disposed in the substrate, and further including a first electrode, a second piezoelectric layer, and a second electrode stacked on the second air cavity, wherein the second BAW resonator is connected in parallel to the first BAW resonator and has polarities that are opposite of polarities of the first BAW resonator; and a compensation capacitor circuit connected between the first BAW resonator and the second BAW resonator.

The compensation capacitor circuit may have capacitance set to compensate for asymmetry of a parallel resonance circuit formed by the first BAW resonator and the second BAW resonator.

The compensation capacitor circuit may include a first compensation capacitor including the first electrode of the first BAW resonator, a dielectric layer stacked on the first electrode of the first BAW resonator, and a metal pad connected to the second electrode of the second BAW resonator and stacked on the dielectric layer to be overlapped with the first electrode of the first BAW resonator.

The compensation capacitor circuit may include a first compensation capacitor including the first electrode of the second BAW resonator a dielectric layer stacked on the first electrode of the second BAW resonator; and a metal pad connected to the second electrode of the first BAW resonator, and stacked on the dielectric layer to be overlapped with the first electrode of the second BAW resonator.

The compensation capacitor circuit may further include a second compensation capacitor including the first electrode of the second BAW resonator, a dielectric layer stacked on the first electrode of the second BAW resonator, and a metal pad connected to the second electrode of the first BAW resonator, and stacked on the dielectric layer to be overlapped with the first electrode of the second BAW resonator.

The compensation capacitor circuit may further include a second compensation capacitor including the first electrode of the first BAW resonator, a dielectric layer stacked on the first electrode of the first BAW resonator, and a metal pad connected to the second electrode of the second BAW resonator, and stacked on the dielectric layer to be overlapped with the first electrode of the first BAW resonator.

The compensation capacitor circuit may further include a first compensation capacitor circuit connected in parallel to the first compensation capacitor, and having one of a fixed capacitance and a variable capacitance.

In another general aspect, a BAW filter includes: a series BAW resonance circuit including series BAW resonators disposed on a substrate and connected in series between a first terminal and a second terminal; and a shunt BAW resonance circuit including shunt BAW resonators disposed on the substrate and connected between respective electrodes of the series BAW resonators and a ground. One of the shunt BAW resonators includes a first BAW resonator, a second BAW resonator, and a compensation capacitor circuit connected between the first BAW resonator and the second BAW resonator. The first BAW resonator includes a first air cavity disposed in the substrate, and further including a first electrode, a first piezoelectric layer, and a second electrode stacked on the first air cavity. The second BAW resonator includes a second air cavity disposed in the substrate, and further includes a first electrode, a second piezoelectric layer, and a second electrode stacked on the second air cavity. The second BAW resonator is connected in parallel to the first BAW resonator and has polarities that are opposite of polarities of the first BAW resonator.

The compensation capacitor circuit may have capacitance set to compensate for asymmetry of a parallel resonance circuit formed by the first BAW resonator and the second BAW resonator.

The compensation capacitor circuit may include a first compensation capacitor including the first electrode of the first BAW resonator, a dielectric layer stacked on the first electrode of the first BAW resonator, and a metal pad connected to the second electrode of the second BAW resonator, and stacked on the dielectric layer to be overlapped with the first electrode of the first BAW resonator.

The compensation capacitor circuit may include a first compensation capacitor including the first electrode of the second BAW resonator, a dielectric layer stacked on the first electrode of the second BAW resonator, and a metal pad connected to the second electrode of the first BAW resonator, and stacked on the dielectric layer to be overlapped with the first electrode of the second BAW resonator.

The compensation capacitor circuit may further include a second compensation capacitor including the first electrode of the second BAW resonator, a dielectric layer stacked on the first electrode of the second BAW resonator, and a metal pad connected to the second electrode of the first BAW resonator, and stacked on the dielectric layer to be overlapped with the first electrode of the second BAW resonator.

The compensation capacitor circuit may further include a second compensation capacitor including the first electrode of the first BAW resonator, a dielectric layer stacked on the first electrode of the first BAW resonator, and a metal pad connected to the second electrode of the second BAW resonator, and stacked on the dielectric layer to be overlapped with the first electrode of the first BAW resonator.

The compensation capacitor circuit may further include a first compensation capacitor circuit connected in parallel to the first compensation capacitor, and having one of a fixed capacitance and a variable capacitance.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1A:
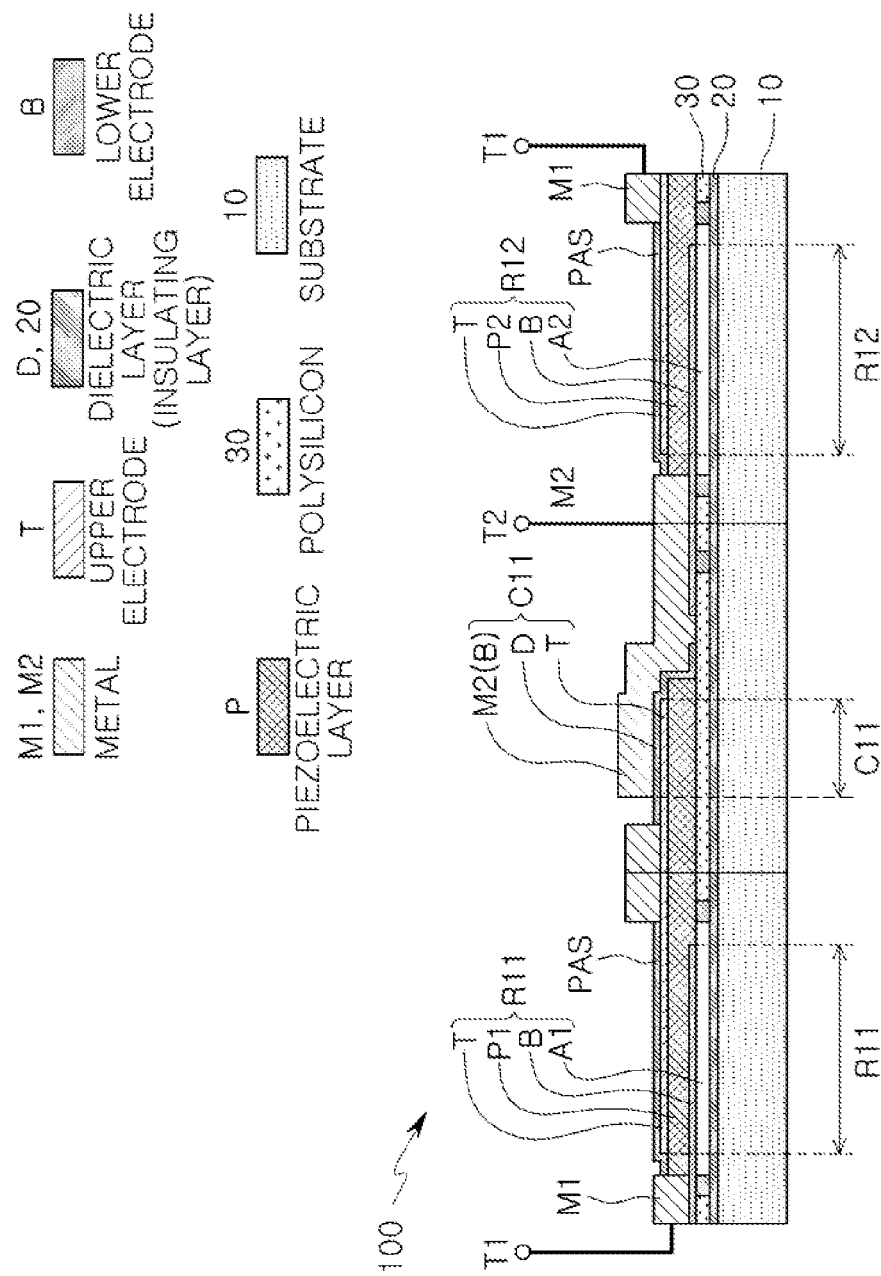
FIG. 1A is a cross-sectional view illustrating a BAW resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
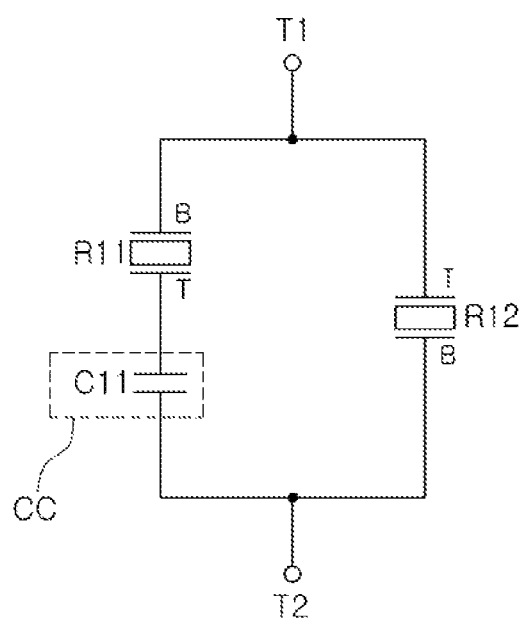
FIG. 1B is an equivalent circuit diagram of the BAW resonator of FIG. 1A.

FIG. 1A is a cross-sectional view illustrating a BAW resonator 100, according to an embodiment. FIG. 1B is an equivalent circuit diagram of the BAW resonator 1.

Referring to FIGS. 1A and 1B, the BAW resonator 100 includes a substrate 10, a first BAW resonator R11, a second BAW resonator R12, and a compensation capacitor circuit CC (FIG. 1B), having a first compensation capacitor C11.

In an example, the substrate 10 is a silicon substrate.

In an example, the first BAW resonator R11 includes a first air cavity A1 disposed in the substrate 10, and a first electrode T, a first piezoelectric layer P1, and a second electrode B that are stacked on the first air cavity A1.

The second BAW resonator R12 includes a second air cavity A2 disposed in the substrate 10, and a first electrode T, a second piezoelectric layer P2, and a second electrode B that are stacked on the second air cavity A2. The second BAW resonator R12 is connected in parallel to the first BAW resonator R11. The first BAW resonator R11 has polarities that are opposite of the polarities of the second BAW resonator R12. Insulating layers for protection are stacked on the first electrode T of the first BAW resonator R11 and on the first electrode T of the second BAW resonator R12.

The compensation capacitor circuit CC of FIG. 1B is connected between the first BAW resonator R11 and the second BAW resonator R12.

The compensation capacitor circuit CC has a capacitance set to compensate for the asymmetry of a parallel resonance circuit formed by the first BAW resonator R11 and the second BAW resonator R12.

Referring to FIG. 1A, the compensation capacitor circuit CC includes the first compensation capacitor C11, which includes the first electrode T of the first BAW resonator R11, a dielectric layer D stacked on the first electrode T of the first BAW resonator R11, and a metal pad M2 connected to the second electrode B of the second BAW resonator R12, and stacked on the dielectric layer D to be overlapped with the first electrode T of the first BAW resonator R11.

Each of the first BAW resonator R11 and the second BAW resonator R12 is disposed between a first terminal T1 and a second terminal T2. The first terminal T1 is connected to the second electrode B of the first BAW resonator R11 and the first electrode T of the second BAW resonator R12 through a metal pad M1. The second terminal T2 is connected to the second electrode B of the second BAW resonator R12 through the metal pad M2, and the metal pad M2 is stacked on the dielectric layer D of the first compensation capacitor C11.

Passivation (PAS) layers including an insulating material are stacked on the first electrode T of the first BAW resonator R11 and on the first electrode T of the second BAW resonator R12.

An insulating layer 20 is disposed between the substrate 10 and the first air cavity A1 and between the substrate 10 and the second air cavity A2.

In an example, a polysilicon layer 30 is disposed between the first air cavity A1 and the second air cavity A2.

For example, as illustrated in FIG. 1A, each of the first and second electrodes T and B is formed of any one or any combination of any two or more of gold (Au), titanium (Ti), tantalum (Ta), molybdenum (Mo), ruthenium (Ru), platinum (Pt), tungsten (W), aluminum (Al), iridium (Ir), and nickel (Ni), or any alloy thereof.

Further, each of the first and second piezoelectric layers P1 and P2 is a part of the BAW resonator 100 that causes a piezoelectric effect converting electrical energy into mechanical energy in the form of elastic waves, and is formed of any one or any combination of any two or more of aluminum nitride (AlN), zinc oxide (ZnO), and a lead zirconium titanium oxide (PZT; PbZrTiO). Further, each of the first and second piezoelectric layers P1 and P2 may include a rare earth metal. In an example, the rare earth metal includes one of scandium (Sc), erbium (Er), yttrium (Y), and lanthanum (La).

The PAS layers include a silicon oxide-based, silicon nitride-based, or aluminum nitride-based insulating material.

Referring to FIG. 1B, in the equivalent circuit of the BAW resonator 100, the first BAW resonator R11 and the second BAW resonator R12 are disposed between the first terminal T1 and the second terminal T2, and each include the first electrode T and the second electrode B.

The compensation capacitor circuit CC is connected between the first terminal T1 of the first BAW resonator R11 and the second terminal T2.

The compensation capacitor circuit CC includes capacitance set to compensate for the asymmetry between the first BAW resonator R11 and the second BAW resonator R12 connected in parallel to the first BAW resonator R11, and having polarities opposite of polarities of the first BAW resonator R11.

In the following portions of the disclosure, redundant descriptions of the same elements in the drawings may be omitted, and differences from previous embodiments will be described.

Figure 2A:
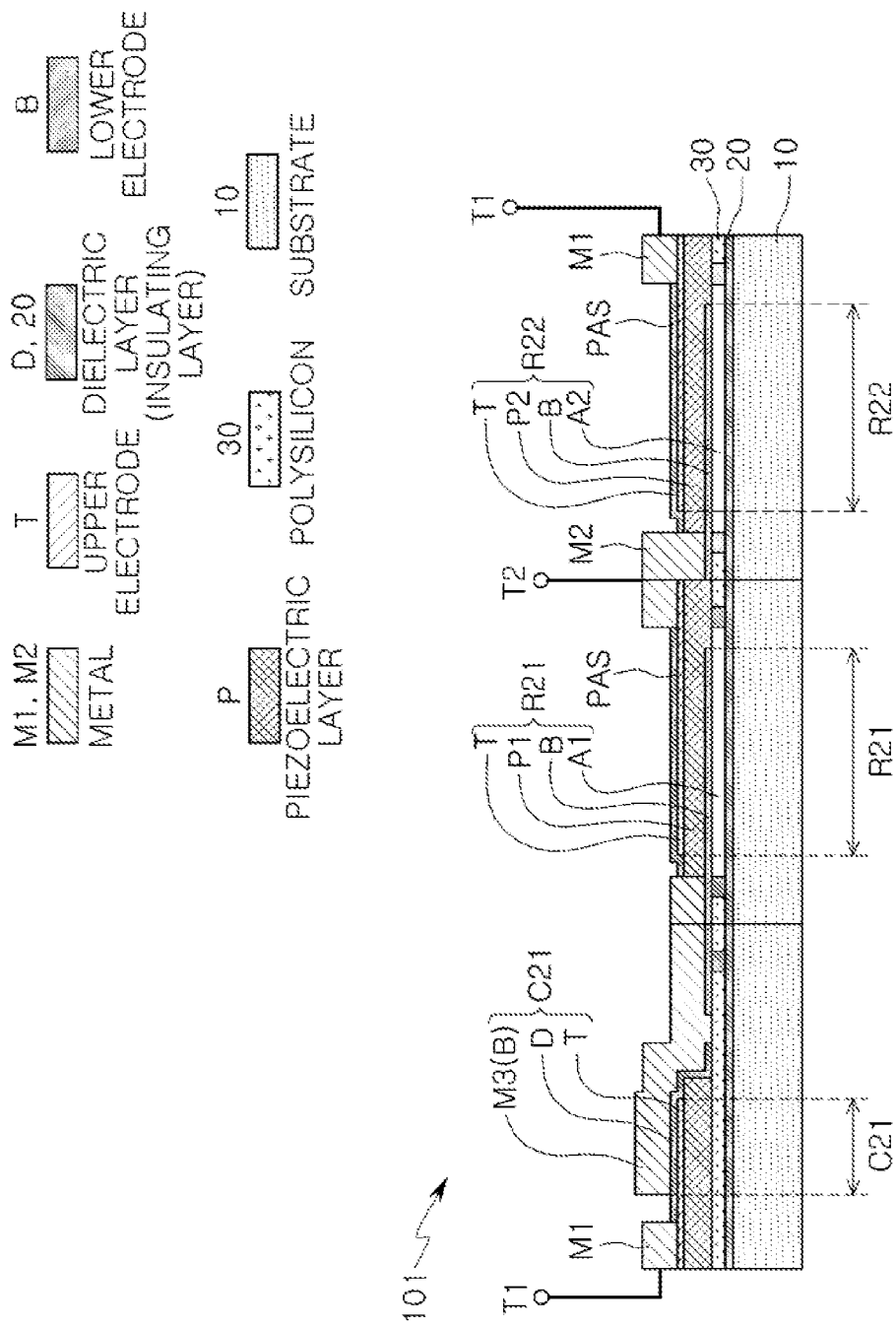
FIG. 2A is a cross-sectional view illustrating a BAW resonator, according to another embodiment.
Figure 2B:
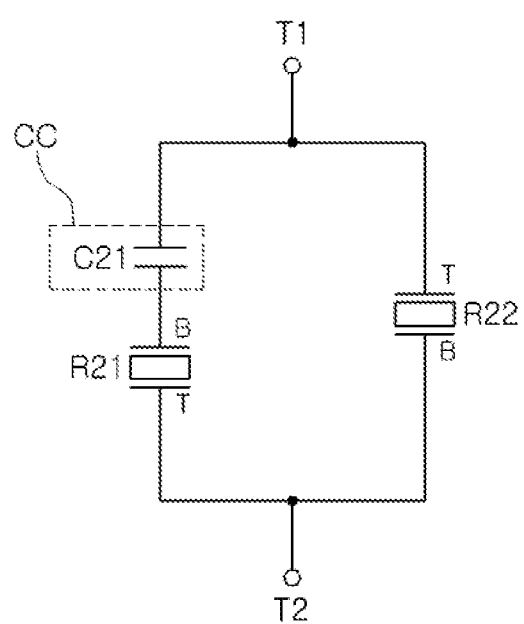
FIG. 2B is an equivalent circuit diagram of the BAW resonator of FIG. 2A.

FIG. 2A is a cross-sectional view illustrating an example of a BAW resonator 101, according to an embodiment. FIG. 2B is an equivalent circuit diagram of the BAW resonator 101.

Referring to FIGS. 2A and 2B, a compensation capacitor circuit CC includes a first compensation capacitor C21, which includes a first electrode T of a second BAW resonator R22, a dielectric layer D stacked on the first electrode T of the second BAW resonator R22, and a metal pad M3 connected to a second electrode B of a first BAW resonator R21, and stacked on the dielectric layer D to be overlapped with the first electrode T of the second BAW resonator R22.

Each of the first BAW resonator R21 and the second BAW resonator R22 is disposed between a first terminal T1 and a second terminal T2. The first terminal T1 is connected to the first electrode T of the second BAW resonator R22 through the metal pad M1, and is connected to the second electrode B of the first BAW resonator R21 through the first compensation capacitor C21. The second terminal T2 is connected to the second electrode B of the first BAW resonator R21 and the second electrode B of the second BAW resonator R22 through the metal pad M2.

PAS layers are stacked on the first electrode T of the first BAW resonator R21 and on the first electrode T of the second BAW resonator R22.

An insulating layer 20 is disposed between a substrate 10 and a first air cavity A1 and between the substrate 10 and a second air cavity A2.

In an example, a polysilicon layer 30 is disposed between the first air cavity A1 and the second air cavity A2.

Referring to FIG. 2B, in the equivalent circuit of the BAW resonator i101, the first BAW resonator R21 and the second BAW resonator R22 are disposed between the first terminal T1 and the second terminal T2, and each include the first electrode T and the second electrode B.

The compensation capacitor circuit CC is connected between the second electrode B of the first BAW resonator R21 and the first terminal T1.

The compensation capacitor circuit CC includes capacitance set to compensate for the asymmetry between the first BAW resonator R21 and the second BAW resonator R22 connected in parallel to the first BAW resonator R21, and having polarities opposite of polarities of the first BAW resonator R21.

Figure 3A:
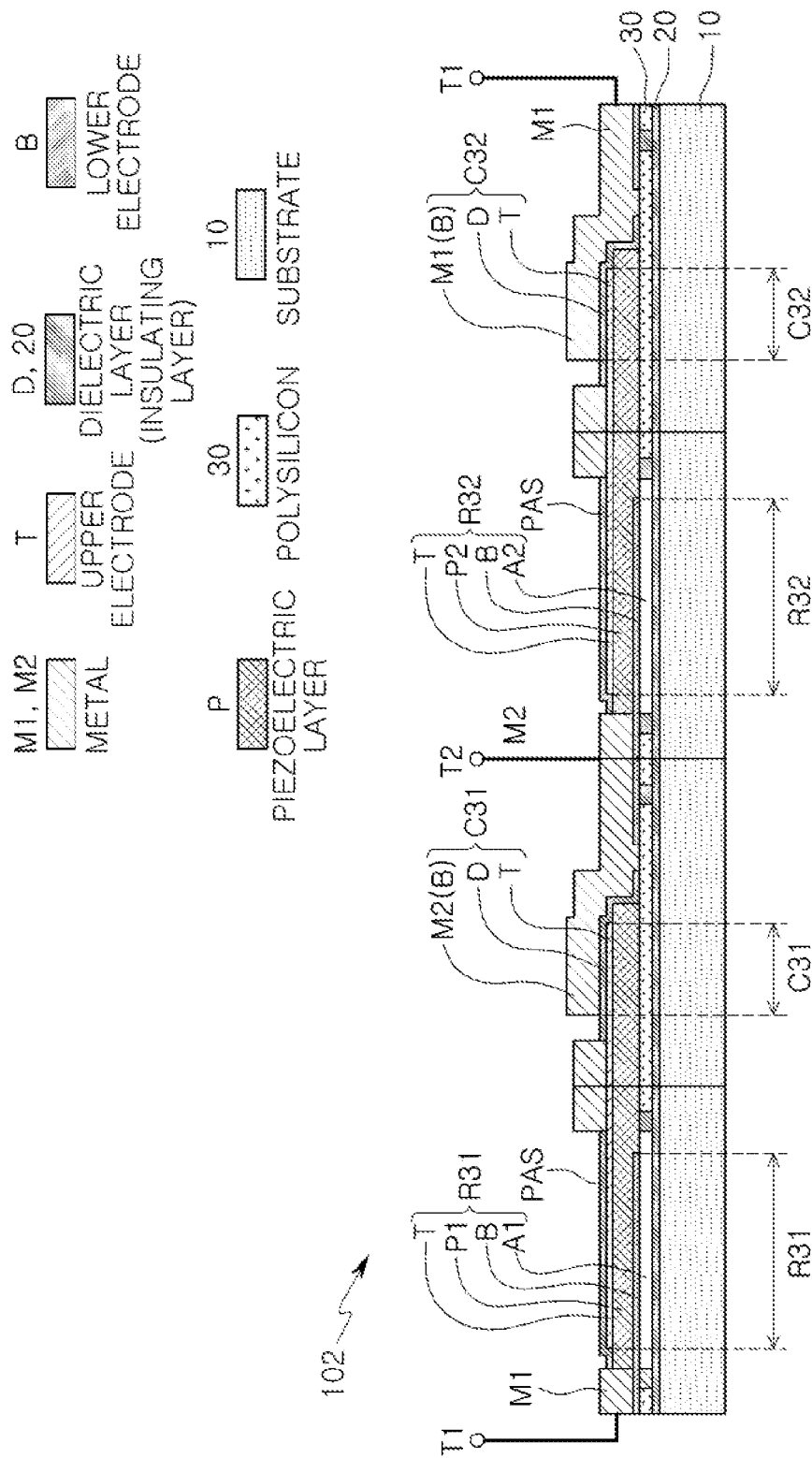
FIG. 3A is a cross-sectional view illustrating a parallel BAW resonator, according to an embodiment.
Figure 3B:
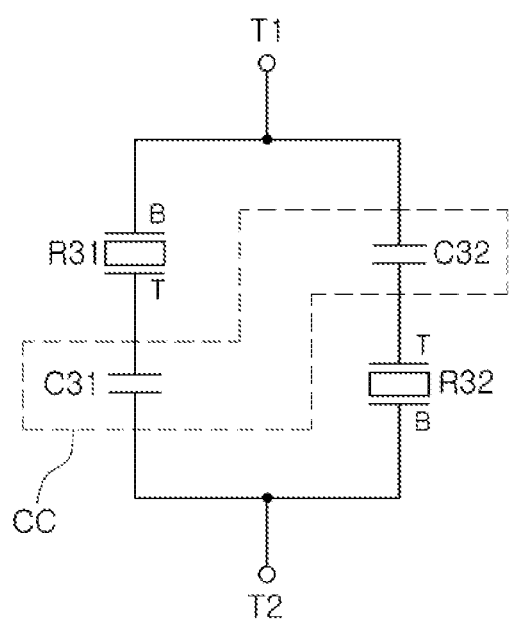
FIG. 3B is an equivalent circuit diagram of the parallel BAW resonator of FIG. 3A.

FIG. 3A is a cross-sectional view illustrating a parallel BAW resonator 102, according to an embodiment. FIG. 3B is an equivalent circuit diagram of the parallel BAW resonator 102.

Referring to FIGS. 3A and 3B, a compensation capacitor circuit CC includes a first compensation capacitor C31 and a second compensation capacitor C32.

A structure of the first compensation capacitor C31 is the same as that of the first compensation capacitor C11 illustrated in FIG. 1B. In an example, the first compensation capacitor C31 includes a first electrode T of a first BAW resonator R31, a dielectric layer D stacked on the first electrode T of the first BAW resonator R31, and a metal pad M2 connected to a second electrode B of a second BAW resonator R32, and stacked on the dielectric layer D to be overlapped with the first electrode T of the first BAW resonator R31.

In an example, the second compensation capacitor C32 includes a first electrode T of the second BAW resonator R32, a dielectric layer D stacked on the first electrode T of the second BAW resonator R32, and a metal pad M1 connected to a second electrode B of the first BAW resonator R31, and stacked on the dielectric layer D to be overlapped with the first electrode T of the second BAW resonator R32.

Each of the first BAW resonator R31 and the second BAW resonator R32 is disposed between a first terminal T1 and a second terminal T2, and the first terminal T1 is connected to the second electrode B of the first BAW resonator R31 through the metal pad M1 and is connected to the first electrode T of the second BAW resonator R32 through the second compensation capacitor C32. The second terminal T2 is connected to the second electrode B of the second BAW resonator R32 through the metal pad M2 and is connected to the first electrode T of the first BAW resonator R31 through the first compensation capacitor C31.

PAS layers are stacked on the first electrode T of the first BAW resonator R31 and on the first electrode T of the second BAW resonator R32.

An insulating layer 20 is disposed between a substrate 10 and a first air cavity A1 and between the substrate 10 and a second air cavity A2.

In an example, a polysilicon layer 30 is disposed between the first air cavity A1 and the second air cavity A2.

Referring to FIG. 3B, in the equivalent circuit of the BAW resonator 102, the first BAW resonator R31 and the second BAW resonator R32 are disposed between the first terminal T1 and the second terminal T2, and each include the first electrode T and the second electrode B.

The first compensation capacitor C31 is connected between the first electrode T of the first BAW resonator R31 and the second terminal T2, and the second compensation capacitor C32 is connected between the first electrode T of the second BAW resonator R32 and the first terminal T1.

The compensation capacitor circuit CC includes capacitance set to compensate for the asymmetry between the first BAW resonator R31 and the second BAW resonator R32 connected in parallel to the first BAW resonator R31, and having polarities opposite of polarities of the first BAW resonator R31.

In an embodiment, the parallel connection between the first and second BAW resonators R31 and R32 having different polarities refers to a parallel connection between the first and second BAW resonators R31 and R32 having opposite polarities. For example, the first electrode T of the first BAW resonator R31 is connected to the second electrode B of the second BAW resonator, and the second electrode B of the first BAW resonator R31 is connected to the first electrode T of the second BAW resonator. In this case, a circuit, such as a capacitor element, is further connected between the first and second BAW resonators R31 and R32 having different polarities.

Figure 4A:
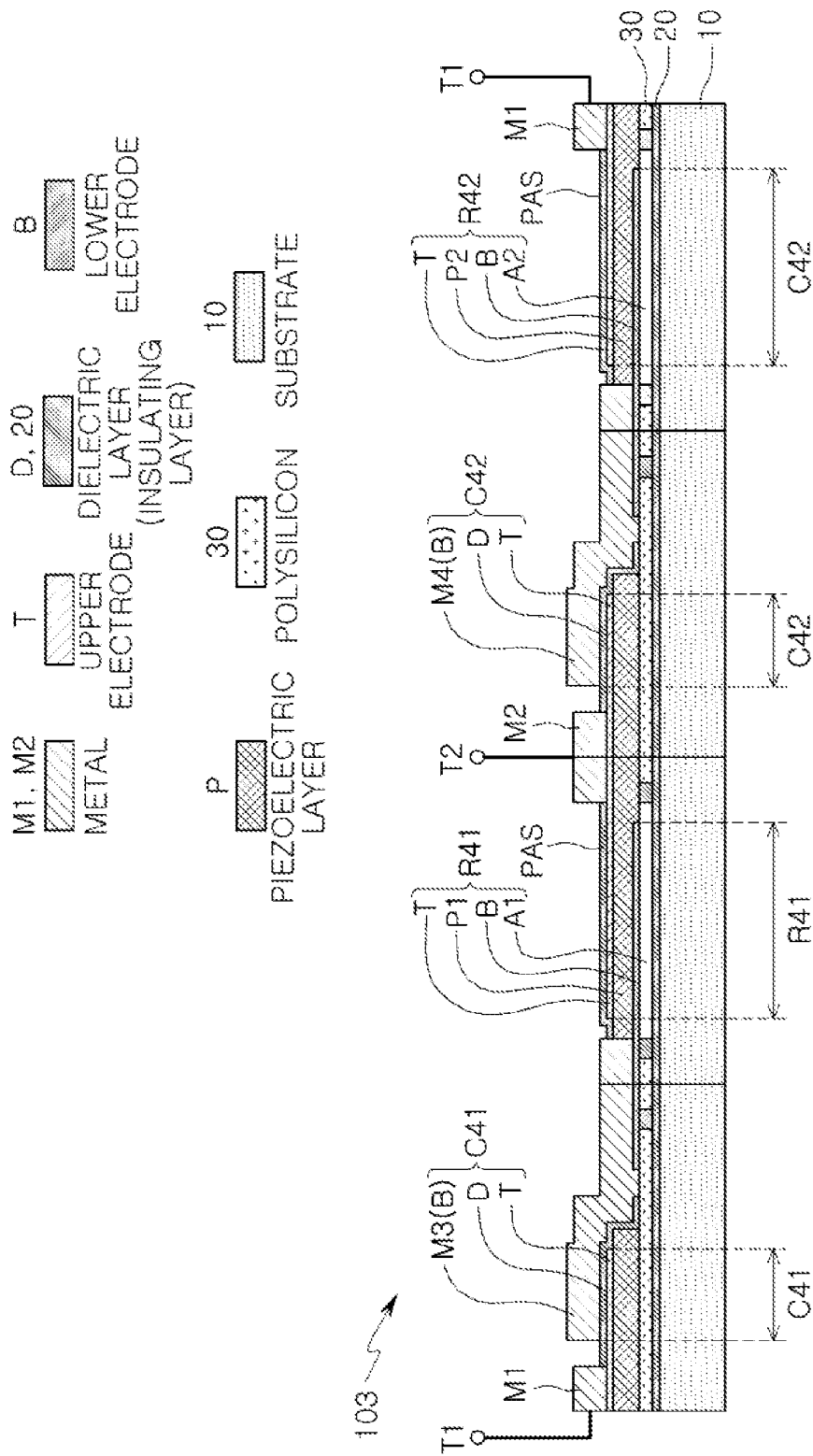
FIG. 4A is a cross-sectional view illustrating a parallel BAW resonator, according to another embodiment.
Figure 4B:
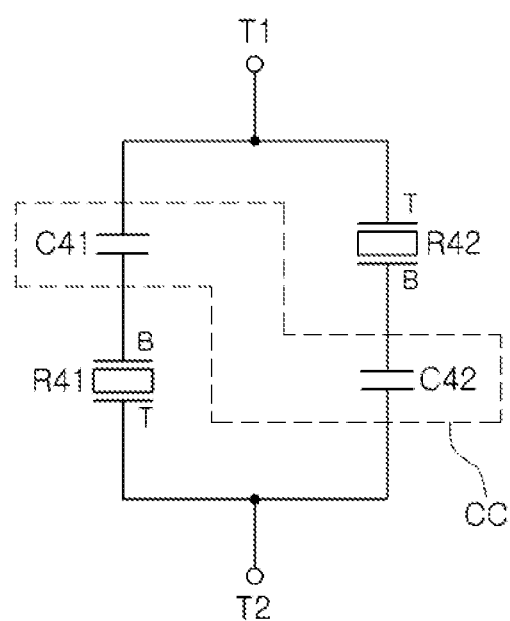
FIG. 4B is an equivalent circuit diagram of the parallel BAW resonator of FIG. 4A.

FIG. 4A is a cross-sectional view illustrating a parallel BAW resonator 103, according to an embodiment. FIG. 4B is an equivalent circuit diagram of the parallel BAW resonator 103.

Referring to FIGS. 4A and 4B, a compensation capacitor circuit CC includes a first compensation capacitor C41 and a second compensation capacitor C42.

A structure of the first compensation capacitor C41 is the same as that of the first compensation capacitor C21 illustrated in FIG. 2B. In an example, the first compensation capacitor C41 includes a first electrode T of a second BAW resonator R42, a dielectric layer D stacked on the first electrode T of the second BAW resonator R42, and a metal pad M3 connected to a second electrode B of a first BAW resonator R41, and stacked on the dielectric layer D to be overlapped with the first electrode T of the second BAW resonator R42.

In an example, the second compensation capacitor C42 includes a first electrode T of the first BAW resonator R41, a dielectric layer D stacked on the first electrode T of the first BAW resonator R41, and a metal pad M4 connected to a second electrode B of the second BAW resonator R42, and stacked on the dielectric layer D to be overlapped with the first electrode T of the first BAW resonator R41.

Each of the first BAW resonator R41 and the second BAW resonator R42 is disposed between a first terminal T1 and a second terminal T2, and the first terminal T1 is connected to the first electrode T of the second BAW resonator R42 through a metal pad M1 and is connected to the second electrode B of the first BAW resonator R41 through the first compensation capacitor C41. The second terminal T2 is connected to the first electrode T of the first BAW resonator R41 through the metal pad M2 and is connected to the second electrode B of the second BAW resonator R42 through the second compensation capacitor C42.

PAS layers are stacked on the first electrode T of the first BAW resonator R41 and on the first electrode T of the second BAW resonator R42.

An insulating layer 20 is disposed between a substrate 10 and a first air cavity A1 and between the substrate 10 and a second air cavity A2.

In an example, a polysilicon layer 30 is disposed between the first air cavity A1 and the second air cavity A2.

Referring to FIG. 4B, in the equivalent circuit of the BAW resonator 103, the first BAW resonator R41 and the second BAW resonator R42 are disposed between the first terminal T1 and the second terminal T2, and each include the first electrode T and the second electrode B.

The first compensation capacitor C31 is connected between the second electrode B of the first BAW resonator R41 and the first terminal T1, and the second compensation capacitor C42 is connected between the second electrode B of the second BAW resonator R42 and the second terminal T2.

The compensation capacitor circuit CC includes capacitance set to compensate for the asymmetry between the first BAW resonator R41 and the second BAW resonator R42 connected in parallel to the first BAW resonator R41, and having polarities opposite of polarities of the first BAW resonator R41.

Figure 5A:
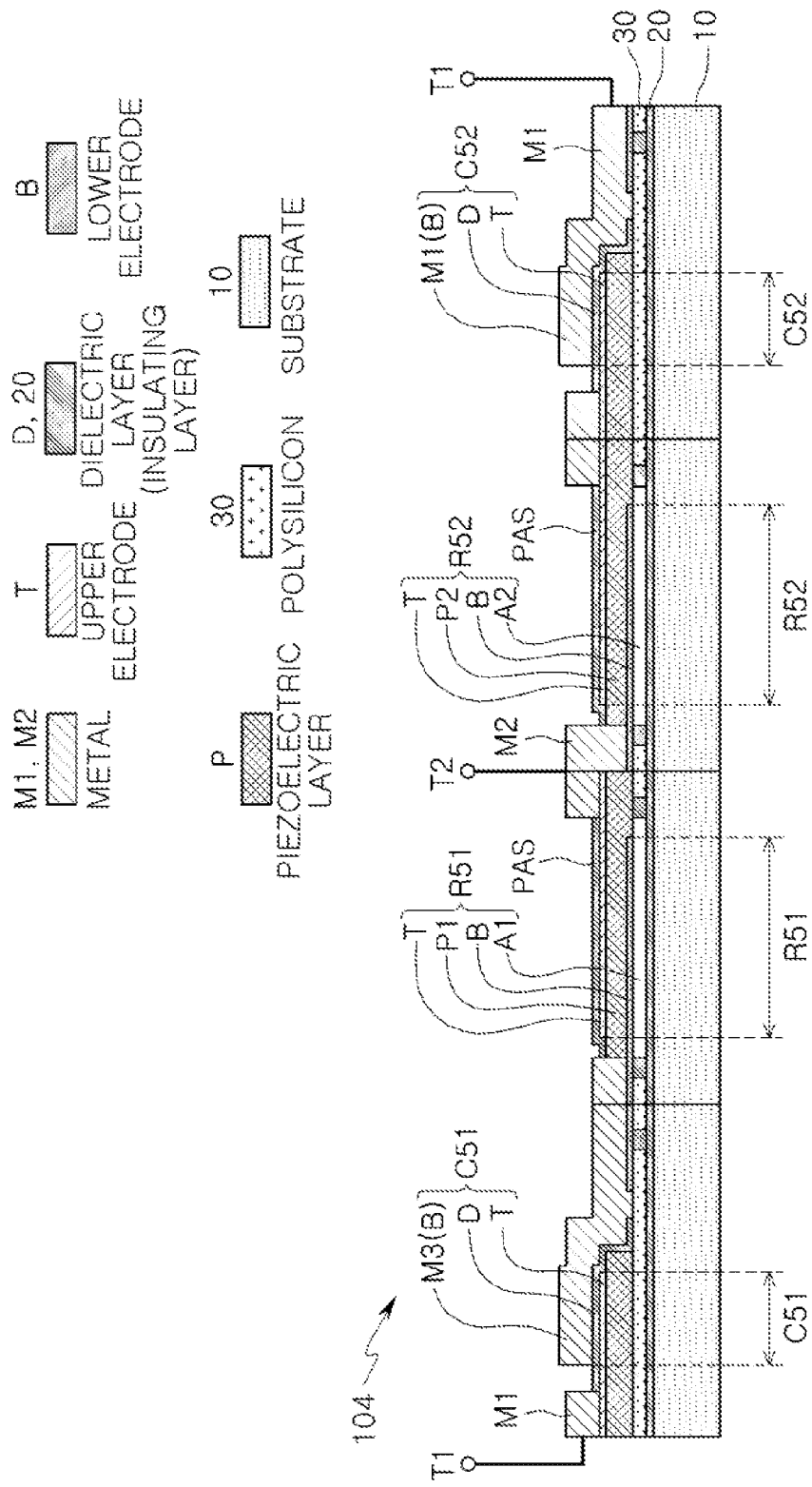
FIG. 5A is a cross-sectional view illustrating a parallel BAW resonator, according to another embodiment.
Figure 5B:
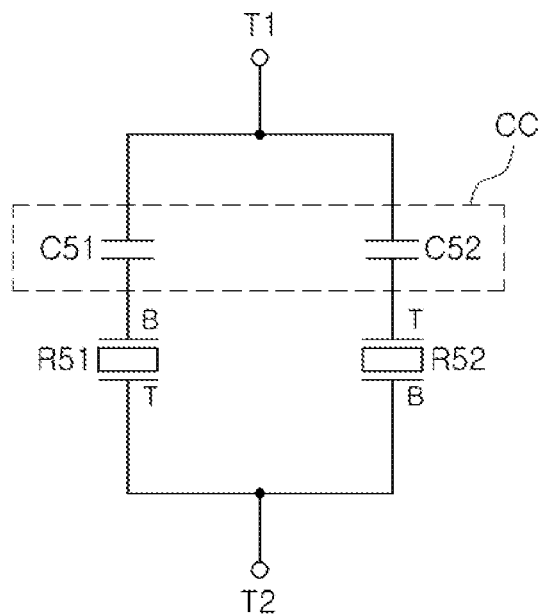
FIG. 5B is an equivalent circuit diagram of the parallel BAW resonator of FIG. 5A.

FIG. 5A is a cross-sectional view illustrating a parallel BAW resonator 104, according to an embodiment. FIG. 5B is an equivalent circuit diagram of the parallel BAW resonator 104.

Referring to FIGS. 5A and 5B, a compensation capacitor circuit CC includes a first compensation capacitor C51 and a second compensation capacitor C52.

A structure of the first compensation capacitor C51 is the same as that of the first compensation capacitor C21 illustrated in FIG. 2B. In an example, the first compensation capacitor C51 includes a first electrode T connected to a first terminal T1, a dielectric layer D stacked on the first electrode T, and a metal pad M3 connected to a second electrode B of the first BAW resonator R51, and stacked on the dielectric layer D to be overlapped with a first electrode T of a second BAW resonator R52.

A structure of the second compensation capacitor C52 is the same as that of the second compensation capacitor C32 illustrated in FIG. 3B. In an example, the second compensation capacitor C52 includes the first electrode T of the second BAW resonator R52, a dielectric layer D stacked on the first electrode T of the second BAW resonator R52, and a metal pad M1 connected to a second electrode B connected to the first terminal T1, and stacked on the dielectric layer D to be overlapped with the first electrode T of the second BAW resonator R52.

Figure 6:
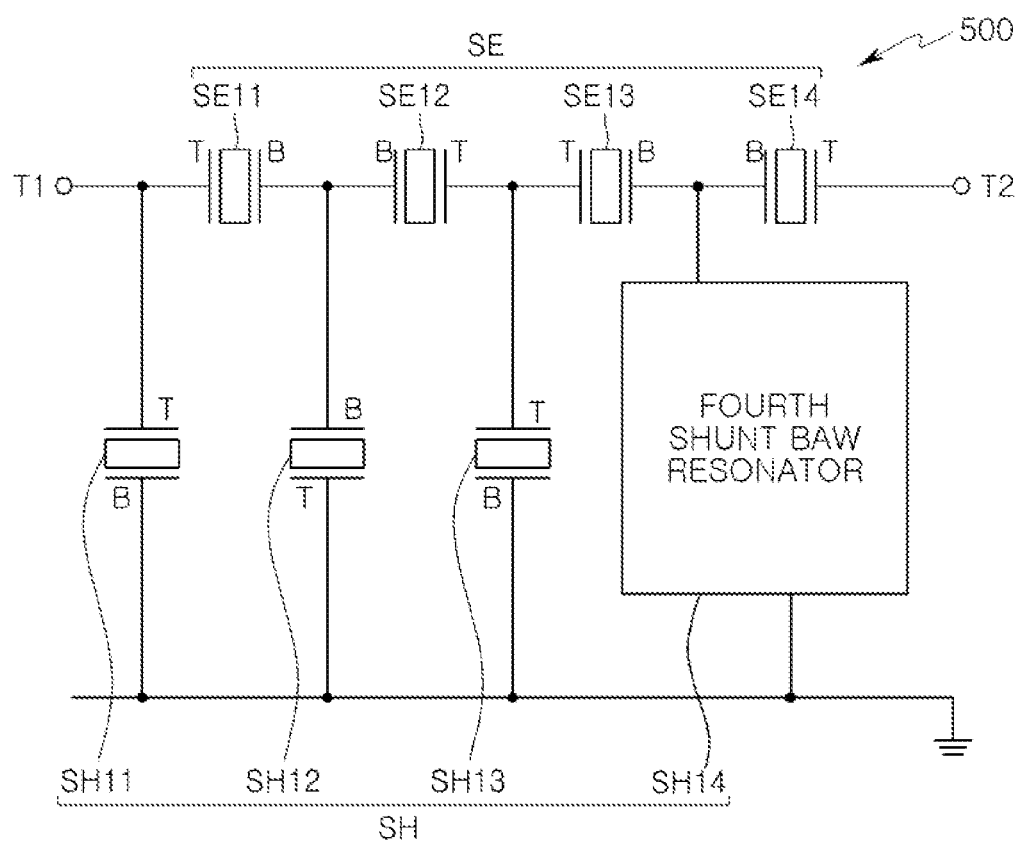
FIG. 6 is a circuit diagram illustrating a parallel BAW filter, according to an embodiment.

FIG. 6 is a circuit diagram illustrating a parallel BAW filter 500, according to an embodiment.

Referring to FIG. 6, the parallel BAW filter 500 includes a series BAW resonance circuit SE and a shunt BAW resonance circuit SH.

The series BAW resonance circuit SE includes series BAW resonators SE11 to SE14, which are disposed on a substrate 10, are connected in series between a first terminal T1 and a second terminal T2, and each include a first electrode T and a second electrode B. Although FIG. 6 shows that the series BAW resonance circuit SE includes the first to fourth series BAW resonators SE11 to SE14, the disclosure is not limited to this configuration.

The same electrodes of the first to fourth series BAW resonators SE11 to SE14 are connected to each other. That is, a first electrode T of one of the first to fourth series BAW resonators SE11 to SE14 may be connected to another first electrode T of another one of the first to fourth series BAW resonators SE11 to SE14, and a second electrode B of one of the first to fourth series BAW resonators SE11 to SE14 may be connected to another second electrode B of another one of the first to fourth series BAW resonators SE11 to SE14.

The shunt BAW resonance circuit SH includes first to fourth shunt BAW resonators SH11 to SH14, which are connected between respective first or second electrodes T or B of the first to fourth series BAW resonators SE11 to SE14 and a ground and each include a first electrode T and a second electrode B. Although FIG. 6 shows that the shunt BAW resonance circuit SH includes first to fourth shunt BAW resonators SH11 to SH14, the disclosure is not limited to this configuration.

Each of the first to third shunt BAW resonators SH11 to SH13 includes a first electrode T and a second electrode B, and the same electrodes of the first to third shunt BAW resonators SH11 to SH13 and respective ones of the first to third series BAW resonators SE11 to SE13 are connected to each other. That is, a first electrode T of one of the first to third shunt BAW resonators SH11 to SH13 may be connected to first electrode T of a respective one of the first to third series BAW resonators SE11 to SE13, and a second electrode B of one of the first to third shunt BAW resonators SH11 to SH3 may be connected to a second electrode B of a respective one of the first to third series BAW resonators SE11 to SE13.

In an example, one of the BAW resonator structures illustrated in FIGS. 1 through 4 is applied to the fourth shunt BAW resonator SH14 of the first to fourth shunt BAW resonators SH11 to SH14. The embodiment illustrated in FIG. 6 is only an example. Thus, the disclosure is not limited to the described embodiment.

Referring to FIGS. 1 through 6, the BAW resonator and the BAW filter, according to the respective embodiments, each include a parallel BAW resonator structure and a compensation capacitor circuit. The compensation capacitor circuit includes at least one compensation capacitor, and further includes a compensation capacitor circuit connected in parallel or in series to the compensation capacitor.

Figure 7:
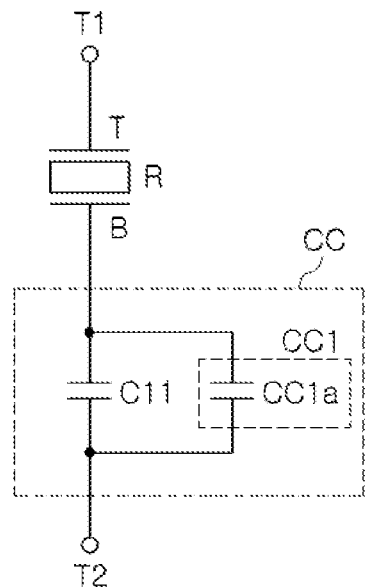
FIG. 7 is a circuit diagram illustrating a compensation capacitor circuit, according to an embodiment.
Figure 8:
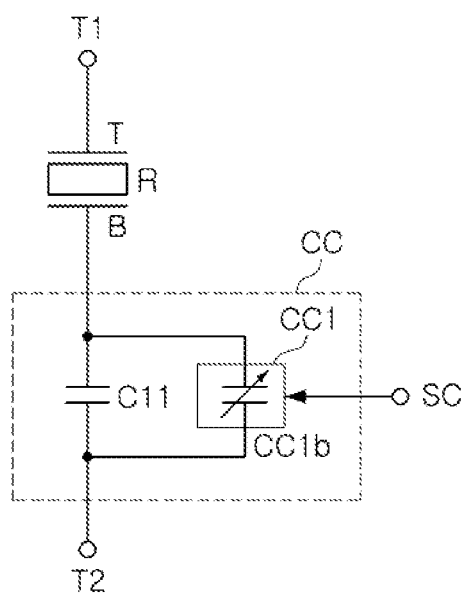
FIG. 8 is a circuit diagram illustrating a compensation capacitor circuit, according to an embodiment.

The compensation capacitor circuit CC, according to the respective embodiments, allows a first compensation capacitor circuit CC1 of FIG. 7 or FIG. 8 to be connected in parallel to at least one of the first compensation capacitors C11, C21, C32, C41, and C51 and the second compensation capacitors C32, C42, and C52. Example implementations of the compensation capacitor circuit CC will be described below with reference to FIGS. 7 and 8.

FIG. 7 is a circuit diagram illustrating the compensation capacitor circuit CC. FIG. 8 is a circuit diagram illustrating another example of the compensation capacitor circuit CC.

Referring to FIGS. 7 and 8, the compensation capacitor circuit CC includes the first compensation capacitor circuit CC1 connected in parallel to the first compensation capacitor C11.

After fabricating the BAW resonator or the BAW filter, it may be difficult to adjust the capacitance of the BAW resonator or the BAW filter itself. Accordingly, the capacitance may be adjusted using the first compensation capacitor circuit CC1.

The embodiments of the first compensation capacitor circuit CC1 illustrated in FIG. 7 or 8 are only examples, and the first compensation capacitor circuit CC1 is connected in parallel to the first compensation capacitor illustrated in FIGS. 1 through 5.

Referring to FIG. 7, the first compensation capacitor circuit CC1 includes a fixed capacitor CC1a.

In another example, referring to FIG. 8, the first compensation capacitor circuit CC1 includes a variable capacitor CC1b.

Capacitance of the variable capacitor CC1b is adjusted in response to a control signal SC. In this case, after fabricating the BAW resonator or the BAW filter, capacitance for asymmetry compensation is adjusted in response to the control signal SC, thus compensating for the asymmetry of the resonance circuit more efficiently.

FIGS. 7 and 8 illustrate structural examples of the first compensation capacitor C11 and the first compensation capacitor circuit CC1. However, the disclosure is not limited to these examples. These structural examples may be applied to a compensation capacitor circuit disposed in a different structure or a different location.

Figure 9:
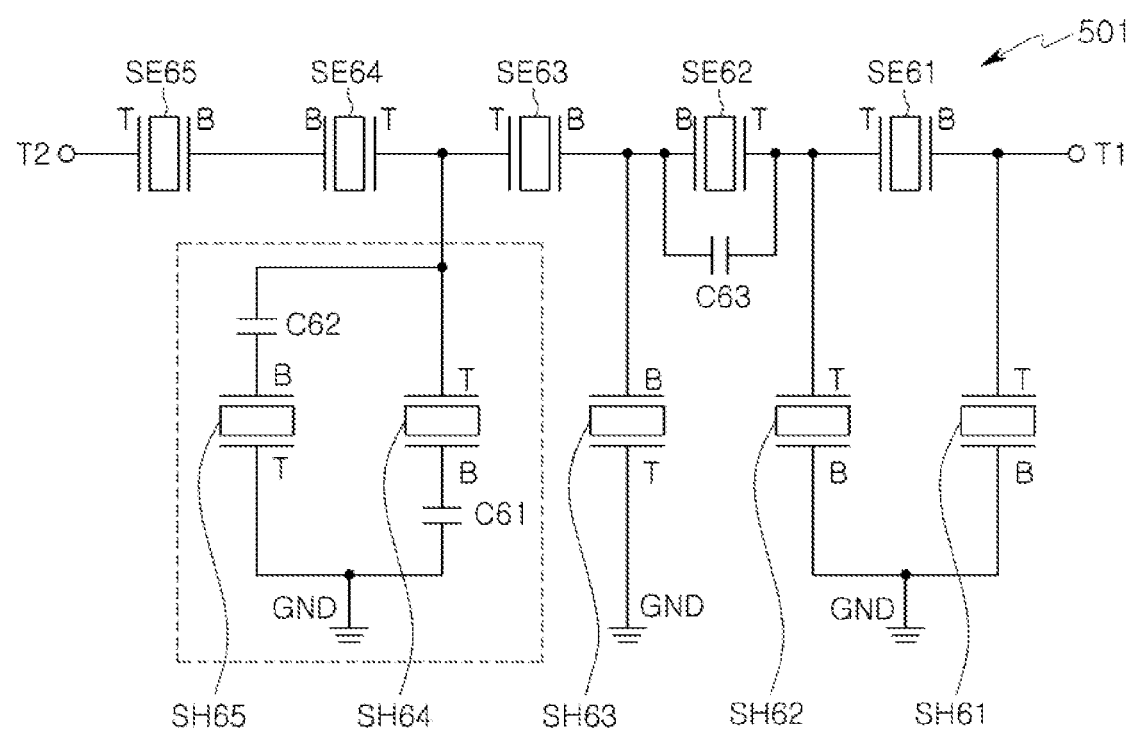
FIG. 9 is a circuit diagram illustrating a BAW filter, according to another embodiment.
Figure 10:
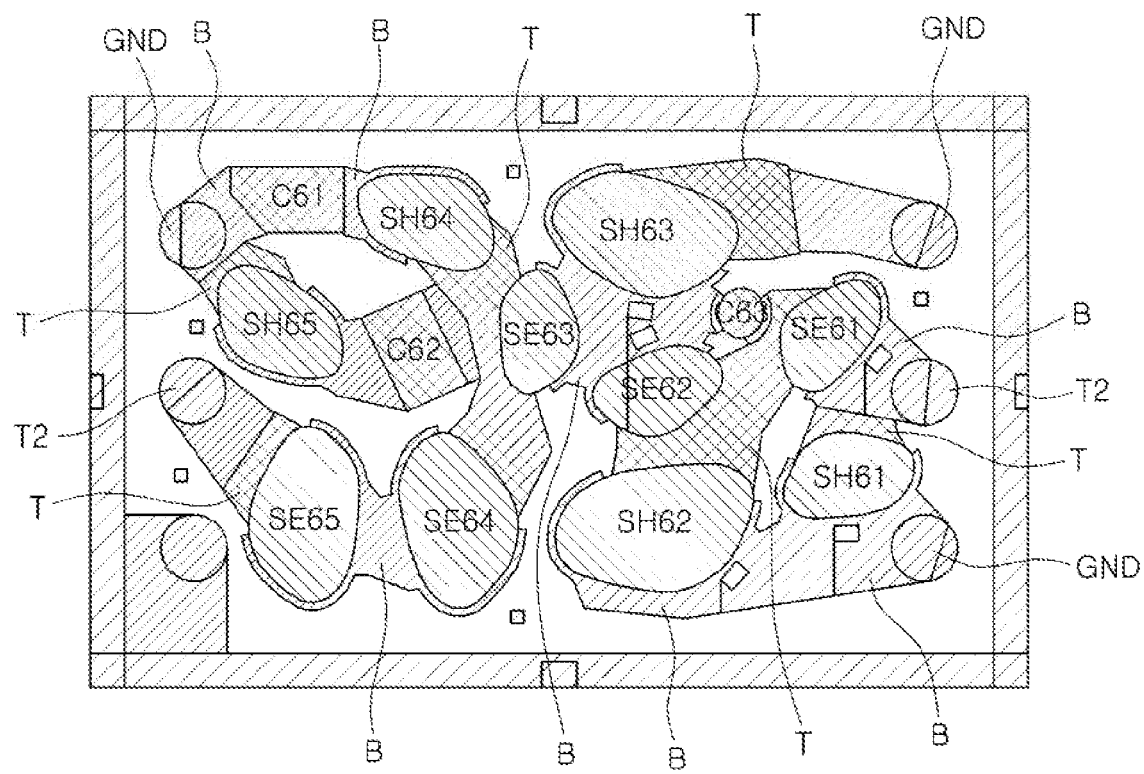
FIG. 10 is a view of an arrangement of an upper electrode, a lower electrode, and a compensation capacitor of the BAW filter illustrated in FIG. 9, according to an embodiment.

FIG. 9 is a circuit diagram illustrating a BAW filter 600, according to another embodiment. FIG. 10 is a view of an arrangement of an upper electrode, a lower electrode, and a compensation capacitor of the BAW filter 501.

Referring to FIGS. 9 and 10, the BAW filter 501 includes, for example, first to fifth series BAW resonators SE61 to SE65 and first to fifth shunt BAW resonators SH61 to SH65. Further, at least two shunt BAW resonators SH64 and SH65 of the first to fifth shunt BAW resonators SH61 to SH65 included in the BAW filter, have a parallel structure in which at least two shunt BAW resonators having different polarities are connected in parallel to each other.

Each of the first and second shunt BAW resonators SH61 and SH62 includes a first electrode T connected to one electrode T or B of each of the first and second series BAW resonator SE61 and SE62, and a second electrode B connected to a ground.

The third shunt BAW resonator SH63 includes a second electrode B connected to, for example, a second electrode B of the third series BAW resonator SE63, and a first electrode T connected to a ground.

Further, a compensation capacitor C61 or C62 is connected to one electrode B or T of at least one of the two shunt BAW resonators SH64 and SH65 having the parallel structure. Alternatively, the compensation capacitor C61 or C62 is connected to at least one electrode, for example, the electrode T or B, of each of the two shunt BAW resonators SH64 and SH65 having the parallel structure.

In an example, the compensation capacitor C61 or C62 is set to have a capacitance of about 5.2 pF. Such capacitance of the compensation capacitor C61 or C62 may be adjusted by resizing an electrode area of the compensation capacitor C61 or C62 in a final fabrication stage of the BAW filter 501, and when the compensation capacitor C61 or C62 is connected to a variable compensation capacitor circuit, the capacitance of the compensation capacitor C61 or C62 may be controlled even after the fabrication thereof. Accordingly, characteristics of the BAW resonator may be adjusted, thus reducing harmonic distortion, such as 2nd harmonic distortion (2HD) or the like.

When a BAW filter is constructed, even in the case in which a compensation capacitor is further added thereto, the size of the BAW filter may not be significantly increased.

In an embodiment, the parallel structure of the two BAW resonators may be a structure in which the two BAW resonators having different polarities may be connected to each other. For example, referring to FIGS. 3A and 3B, the first electrode T of the first BAW resonator R31 is connected to the second electrode B of the second BAW resonator R32 through the first compensation capacitor C31, and the second electrode B of the first BAW resonator R31 is connected to the first electrode T of the second BAW resonator R32 through the second compensation capacitor C32.

In order to reduce harmonic distortion, such as a 2nd harmonic voltage, during the fabrication of the BAW filter, the BAW filter described above, according to an embodiment, may first include the BAW resonator having the parallel structure, in which the two BAW resonators having different polarities are connected to each other, and includes the compensation capacitor connected to one electrode of at least one of the two BAW resonators having the parallel structure to compensate for the asymmetry between the two BAW resonators having the parallel structure. Trimming of the compensation capacitor may allow the BAW filter to have more precise symmetry, thus enabling accurate harmonic distortion attenuation.

As described above, in an embodiment, when forming the BAW resonator in a parallel or series manner, the capacitance for asymmetry compensation may be adjusted to reduce harmonic distortion.

Figure 11:
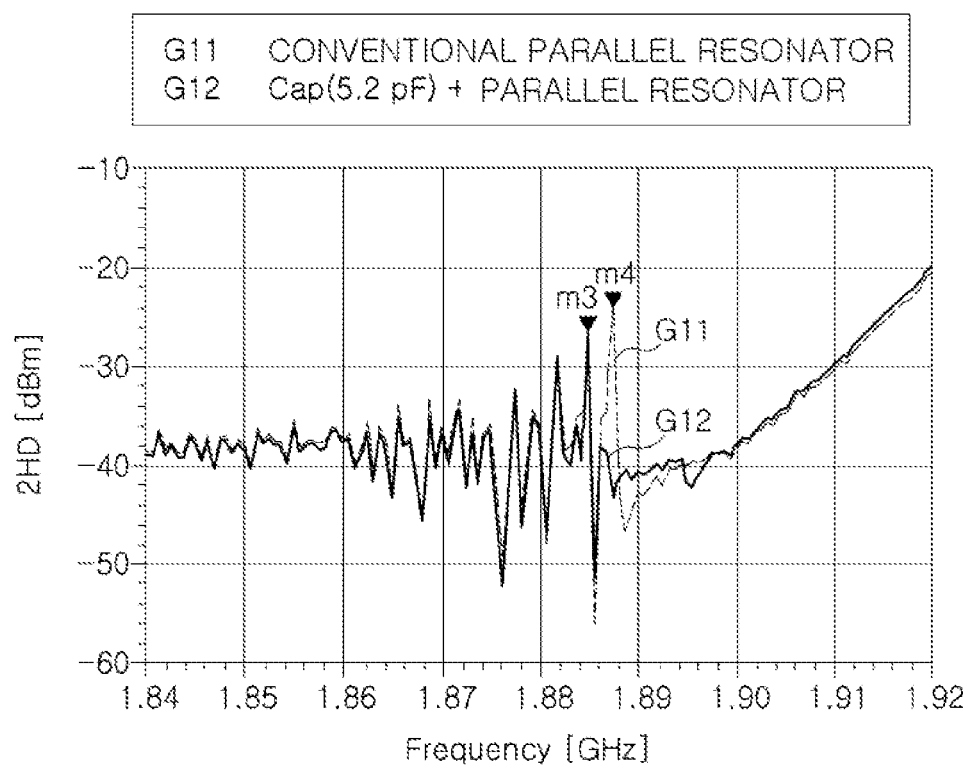
FIG. 11 is a graph of simulation results, according to an embodiment.

FIG. 11 is a graph of simulation results, according to an embodiment.

In FIG. 11, G11 is a graph of simulation results for a conventional parallel BAW resonator, and G12 is a graph of simulation results for the structure including the parallel BAW resonator and the compensation capacitor, having a capacitance of, for example, 5.2 pF, according to an embodiment.

Referring to G11 and G12 of FIG. 11, it can be understood that the magnitude (refer to m3 and m4 of FIG. 11) of harmonic distortion, such as 2HD, is reduced about 2 dB. Accordingly, 2HD may be reduced by adjusting the capacitance of the compensation capacitor.

As described above, in an embodiment, the capacitance of the compensation capacitor manufactured during the fabrication of the BAW resonator may be adjusted to reduce harmonic distortion, such as 2HD, thus improving the characteristics of the BAW filter.

As set forth above, according to the embodiments disclosed herein, a BAW resonator or a BAW filter reduces harmonic distortion, such as 2nd harmonic distortion (2HD), in terms of radio frequency (RF) characteristics, using a compensation capacitor having capacitance that may be adjusted.

Accordingly, the use of the compensation capacitor allows the element characteristics of the BAW resonator or the BAW filter to match specifications thereof. Further, the BAW resonator or the BAW filter adjusts the capacity of the compensation capacitor, thus controlling characteristics due to process deviations and improving harmonic characteristics in terms of RF characteristics.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave (BAW) resonator, comprising:
a substrate;
a first BAW resonator comprising a first air cavity disposed in the substrate, and further comprising a first electrode, a first piezoelectric layer, and a second electrode stacked on the first air cavity;
a second BAW resonator comprising a second air cavity disposed in the substrate, and further comprising a first electrode, a second piezoelectric layer, and a second electrode stacked on the second air cavity, wherein the second BAW resonator is connected in parallel to the first BAW resonator and comprises polarities that are opposite of polarities of the first BAW resonator; and
a compensation capacitor circuit connected between the first BAW resonator and the second BAW resonator.

2. The BAW resonator of claim 1, wherein the compensation capacitor circuit comprises capacitance set to compensate for asymmetry of a parallel resonance circuit formed by the first BAW resonator and the second BAW resonator.

3. The BAW resonator of claim 1, wherein the compensation capacitor circuit comprises a first compensation capacitor, and the first compensation capacitor comprises
the first electrode of the first BAW resonator,
a dielectric layer stacked on the first electrode of the first BAW resonator, and
a metal pad connected to the second electrode of the second BAW resonator and stacked on the dielectric layer to be overlapped with the first electrode of the first BAW resonator.

4. The BAW resonator of claim 3, wherein the compensation capacitor circuit further comprises a second compensation capacitor, and the second compensation capacitor comprises
the first electrode of the second BAW resonator,
a dielectric layer stacked on the first electrode of the second BAW resonator, and
a metal pad connected to the second electrode of the first BAW resonator, and stacked on the dielectric layer to be overlapped with the first electrode of the second BAW resonator.

5. The BAW resonator of claim 3, wherein the compensation capacitor circuit further comprises a second compensation capacitor, and the second compensation capacitor comprises
the first electrode of the first BAW resonator,
a dielectric layer stacked on the first electrode of the first BAW resonator, and
a metal pad connected to the second electrode of the second BAW resonator, and stacked on the dielectric layer to be overlapped with the first electrode of the first BAW resonator.

6. The BAW resonator of claim 3, wherein the compensation capacitor circuit further comprises a first compensation capacitor circuit connected in parallel to the first compensation capacitor, and comprising one of a fixed capacitance and a variable capacitance.

7. The BAW resonator of claim 1, wherein the compensation capacitor circuit comprises a first compensation capacitor, and the first compensation capacitor comprises
the first electrode of the second BAW resonator,
a dielectric layer stacked on the first electrode of the second BAW resonator; and
a metal pad connected to the second electrode of the first BAW resonator, and stacked on the dielectric layer to be overlapped with the first electrode of the second BAW resonator.

8. The BAW resonator of claim 7, wherein the compensation capacitor circuit further comprises a second compensation capacitor, and the second compensation capacitor comprises
the first electrode of the second BAW resonator,
a dielectric layer stacked on the first electrode of the second BAW resonator, and
a metal pad connected to the second electrode of the first BAW resonator, and stacked on the dielectric layer to be overlapped with the first electrode of the second BAW resonator.

9. The BAW resonator of claim 7, wherein the compensation capacitor circuit further comprises a second compensation capacitor, and the second compensation capacitor comprises
the first electrode of the first BAW resonator,
a dielectric layer stacked on the first electrode of the first BAW resonator, and
a metal pad connected to the second electrode of the second BAW resonator, and stacked on the dielectric layer to be overlapped with the first electrode of the first BAW resonator.

10. A BAW filter, comprising:
a series BAW resonance circuit comprising series BAW resonators disposed on a substrate and connected in series between a first terminal and a second terminal; and
a shunt BAW resonance circuit comprising shunt BAW resonators disposed on the substrate and connected between respective electrodes of the series BAW resonators and a ground,
wherein one of the shunt BAW resonators comprises
a first BAW resonator comprising a first air cavity disposed in the substrate, and further comprising a first electrode, a first piezoelectric layer, and a second electrode stacked on the first air cavity,
a second BAW resonator comprising a second air cavity disposed in the substrate, and further comprising a first electrode, a second piezoelectric layer, and a second electrode stacked on the second air cavity, the second BAW resonator being connected in parallel to the first BAW resonator and comprising polarities that are opposite of polarities of the first BAW resonator, and a compensation capacitor circuit connected between the first BAW resonator and the second BAW resonator.

11. The BAW filter of claim 10, wherein the compensation capacitor circuit comprises capacitance set to compensate for asymmetry of a parallel resonance circuit formed by the first BAW resonator and the second BAW resonator.

12. The BAW filter of claim 10, wherein the compensation capacitor circuit comprises a first compensation capacitor, and the first compensation capacitor comprises the first electrode of the first BAW resonator, a dielectric layer stacked on the first electrode of the first BAW resonator, and a metal pad connected to the second electrode of the second BAW resonator, and stacked on the dielectric layer to be overlapped with the first electrode of the first BAW resonator.

13. The BAW filter of claim 12, wherein the compensation capacitor circuit further comprises a second compensation capacitor, and the second compensation capacitor comprises the first electrode of the second BAW resonator, a dielectric layer stacked on the first electrode of the second BAW resonator, and a metal pad connected to the second electrode of the first BAW resonator, and stacked on the dielectric layer to be overlapped with the first electrode of the second BAW resonator.

14. The BAW filter of claim 12, wherein the compensation capacitor circuit further comprises a second compensation capacitor, and the second compensation capacitor comprises the first electrode of the first BAW resonator, a dielectric layer stacked on the first electrode of the first BAW resonator, and a metal pad connected to the second electrode of the second BAW resonator, and stacked on the dielectric layer to be overlapped with the first electrode of the first BAW resonator.

15. The BAW filter of claim 12, wherein the compensation capacitor circuit further comprises a first compensation capacitor circuit connected in parallel to the first compensation capacitor, and comprising one of a fixed capacitance and a variable capacitance.

16. The BAW filter of claim 10, wherein the compensation capacitor circuit comprises a first compensation capacitor, and the first compensation capacitor comprises the first electrode of the second BAW resonator, a dielectric layer stacked on the first electrode of the second BAW resonator, and a metal pad connected to the second electrode of the first BAW resonator, and stacked on the dielectric layer to be overlapped with the first electrode of the second BAW resonator.

17. The BAW filter of claim 16, wherein the compensation capacitor circuit further comprises a second compensation capacitor, and the second compensation capacitor comprises the first electrode of the second BAW resonator, a dielectric layer stacked on the first electrode of the second BAW resonator, and a metal pad connected to the second electrode of the first BAW resonator, and stacked on the dielectric layer to be overlapped with the first electrode of the second BAW resonator.

18. The BAW filter of claim 16, wherein the compensation capacitor circuit further comprises a second compensation capacitor, and the second compensation capacitor comprises the first electrode of the first BAW resonator, a dielectric layer stacked on the first electrode of the first BAW resonator, and a metal pad connected to the second electrode of the second BAW resonator, and stacked on the dielectric layer to be overlapped with the first electrode of the first BAW resonator.

* * * * *